(12) United States Patent
Chawla et al.

(10) Patent No.: US 8,961,193 B2
(45) Date of Patent: Feb. 24, 2015

(54) CHIP SOCKET INCLUDING A CIRCULAR CONTACT PATTERN

(71) Applicant: Intel Corporation, Santa Clara, CA (US)

(72) Inventors: Gaurav Chawla, Tempe, AZ (US); Vijaykumar Krithivasan, Chandler, AZ (US); Joshua D Heppner, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/712,166

(22) Filed: Dec. 12, 2012

(65) Prior Publication Data

US 2014/0162474 A1    Jun. 12, 2014

(51) Int. Cl.
    *H01R 24/86*      (2011.01)

(52) U.S. Cl.
    CPC ..................................... *H01R 24/86* (2013.01)
    USPC .......................................................... 439/68

(58) Field of Classification Search
    USPC ............................... 439/68, 71, 680, 781, 789
    See application file for complete search history.

(56) References Cited

U.S. PATENT DOCUMENTS

| | | | |
|---|---|---|---|
| 3,429,041 A | * | 2/1969 | Patton, Jr. ........................ 29/883 |
| 3,497,866 A | * | 2/1970 | Patton, Jr. ..................... 439/680 |
| 3,831,133 A | * | 8/1974 | Grundfest ..................... 439/680 |
| 4,376,560 A | | 3/1983 | Olsson et al. |
| 4,857,988 A | | 8/1989 | Fottler |
| 4,923,404 A | | 5/1990 | Redmond et al. |
| 5,376,010 A | * | 12/1994 | Petersen ......................... 439/71 |
| 6,379,191 B1 | * | 4/2002 | Goetz et al. ................... 439/660 |
| 6,580,402 B2 | | 6/2003 | Navarro et al. |
| 7,121,838 B2 | | 10/2006 | DeFord et al. |
| 7,666,778 B2 | | 2/2010 | Young |
| 8,025,531 B1 | | 9/2011 | Zhang et al. |

* cited by examiner

*Primary Examiner* — Chandrika Prasad
(74) *Attorney, Agent, or Firm* — Schwegman Lundberg & Woessner, P.A.

(57) ABSTRACT

An apparatus for coupling an integrated circuit to other electronics can include a housing having an exterior and an interior, the exterior having an exterior bottom surface, the interior defined by an interior bottom surface opposite the exterior bottom surface, and at least one sidewall extending away from the interior bottom surface to define an interior shape that is sized to receive the integrated circuit, with the integrated circuit disposed against the interior bottom surface and the at least one sidewall. The example can include a plurality of exterior contacts exposed along the exterior bottom surface in an exterior contact pattern that is generally circular in shape.

10 Claims, 12 Drawing Sheets

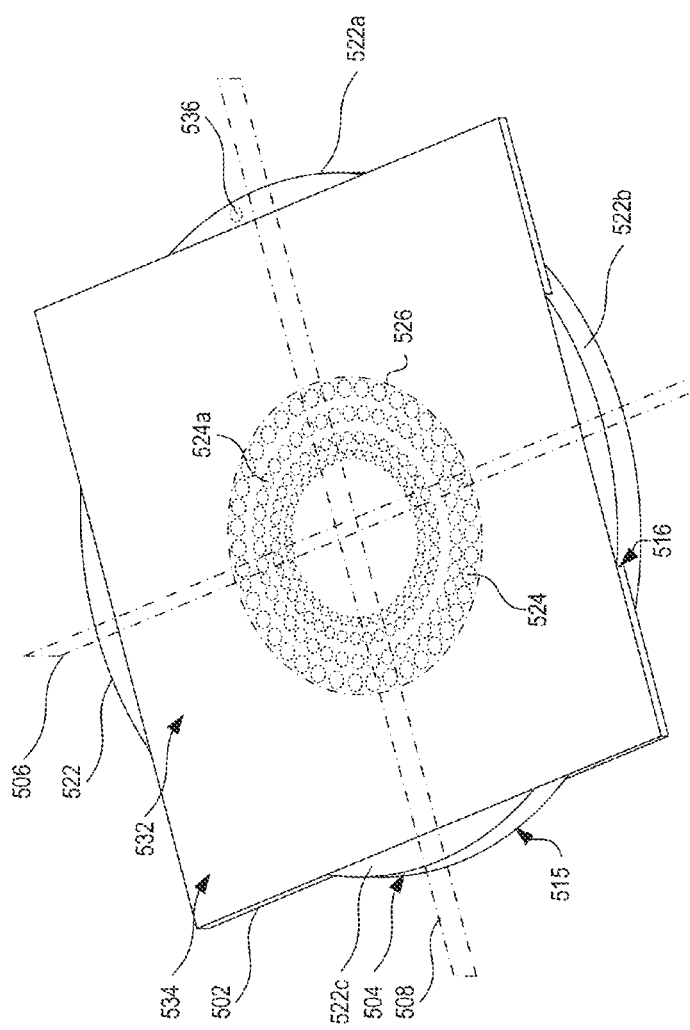
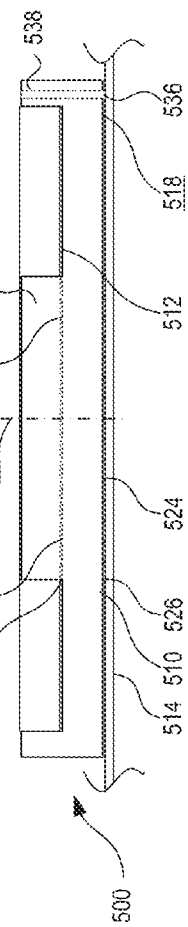
FIG. 5A
FIG. 5B

CHIP SOCKET INCLUDING A CIRCULAR CONTACT PATTERN

TECHNICAL FIELD

Examples generally relate to sockets for integrated circuits, and more specifically to a socket including a circular contact pattern.

BACKGROUND

Electrical sockets can be used to secure electronics, including packaged electronics such as integrated circuits (IC), to other devices such as a system board (e.g. a mother board or a printed circuit board "PCB") of an electronic system. These electrical sockets can provide for installation, and in some cases replacement, of the electronics. Electrical sockets can be provided in different sizes and configurations, including, but not limited to, lower insertion force (LIF) sockets and zero insertion force (ZIF) sockets. Certain sockets, such as land grid array (LGA) sockets, do not rely on pins, instead providing cantilevers that can abut pads of the package.

LIF sockets can be used to detachably secure traditional electronics with lower pin counts to other devices. A LIF configuration can rely on other forces, such as a separate machine or an operator's fingers, to correctly position the electronics into the socket such that contacts of the electronics correctly mate with contacts of the socket. If a machine is correctly aligned with the socket, it can perform assembly with favorable reliability. Operators, on the other hand, can make alignment errors and can fail to detect them, and can damage the components during assembly. Although not necessary, an additional step of inspection of an assembled electronics/socket combination can be used to ensure proper placement, adding cost.

A ZIF socket can include machinery, a part of or integrated with the socket, to assist in placing the electronics in the socket in alignment. ZIF sockets can accommodate larger pin counts than a LIF socket that is not machine assisted, in part because the on-board machinery of the ZIF can perform precision placement that an operator may not be capable of. Thus ZIF sockets can provide for high pin counts and reliable assembly.

An LGA socket may typically include a release handle or lever which can operate a cam screw to open the socket and permit easy installation of electronics into the socket. Subsequent closure of the handle may secure the processor chip in place.

Even with these features, existing sockets suffer from several shortcomings, such as those related to reliable assembly. Sockets are assembled to other components, such as printed circuit boards. Electronics to be disposed in the sockets can include a large number of contacts that may be easily damaged or misaligned; their pads, pins or balls are generally fragile. Accordingly, proper alignment of the electronics to the socket is important so that the proper contact can be made. For at least this reason, any planar warpage of a socket, such as that imparted to the socket from another component to which it is connected, can result in improper assembly of the electronics to the socket, such as by damaging pins or causing misalignment. Similarly, warpage of either or both of the socket and the electronics to be disposed in the socket can result in misalignment. This can result undesirable performance impediments.

Sockets can experience a variety of environmental conditions such as reflow and annealing and can become twisted or turned, and can be inelastically warped out of shape, which exacerbates assembly concerns. Accordingly, there is a need to provide an apparatus and method to ensure that electrical sockets have a flat surface mount region and, in instances in which warpage has arisen, there is a need to provide an apparatus and method to maintain a desirable interior shape into which electronics can be disposed.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 5A is a perspective view of electronics assembled to a socket, according to an example.

FIG. 5B is a side view of the assembly of FIG. 5A.

DETAILED DESCRIPTION

Examples include sockets that provide electrical connections and mechanical support for electronics. They include sockets that include a generally circular contact pattern. The circular contact pattern can be along the exterior of the socket, where the socket attaches to other components. The circular contact pattern can be along the interior of the socket in which the socket is configured to receive electronics such as a packaged integrated circuit. By grouping the contacts into a circular pattern rather than the rectangular pattern of other designs, the present subject matter significantly lowers stress levels subjected to the contacts when one or more of the components of a socket system, such as the socket, the electronics coupled inside to socket, or the components to which the socket is coupled, are undesirably misshaped and demonstrate unfavorable characteristics, such as warpage, or are otherwise placed out of designed-for position.

Figure 1:
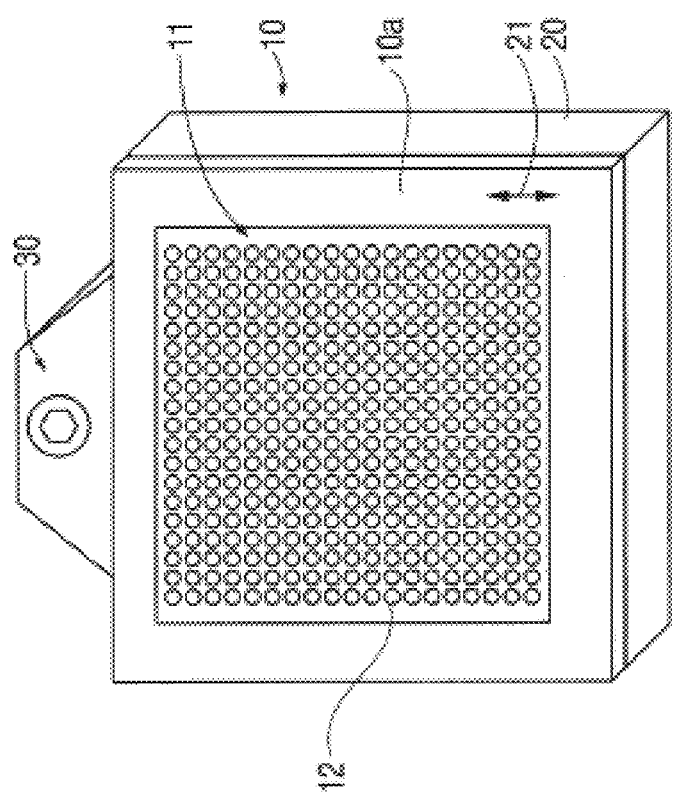
FIG. 1 is a perspective view of a cam activated ZIF socket.

Attention is now directed to the drawings and particularly to FIG. 1, where there is shown a less advantageous ZIF socket 10 of a cam actuated type that can be used to secure an electronic device or electronic package such as a processor chip onto a system board of an electronic system. As shown in FIG. 1, the ZIF socket 10 can include socket housings comprised of a top plate (cover) 10a, a base, 20, and a cam mechanism 30 (e.g., actuated through use of a hexagonal key (e.g., an Allen wrench)). The top plate 10*a* and the base 20 can be made from dielectric materials such as plastics, ceramics and other insulators, and can be varied in sizes, shapes and openings to secure different types of electronics or IC devices onto a system board of an electronic system. The top plate 10*a* can be slidably mounted on the base 20, as indicated by double headed arrow 21. The plate 20 can be movable over an interior bottom surface of the base 20 between an open position and a closed position in response to movement of the cam mechanism 30. The top plate 10*a* of an example ZIF socket 10 can contain a plurality of pin-insertion apertures 12 for accepting electrical pins from an electronic package or electrical device. The apertures 12 are shown deposed in a surface mount region 11. The ZIF socket 10 is a typical socket that experiences warpage of the nature previously described.

Figure 2:
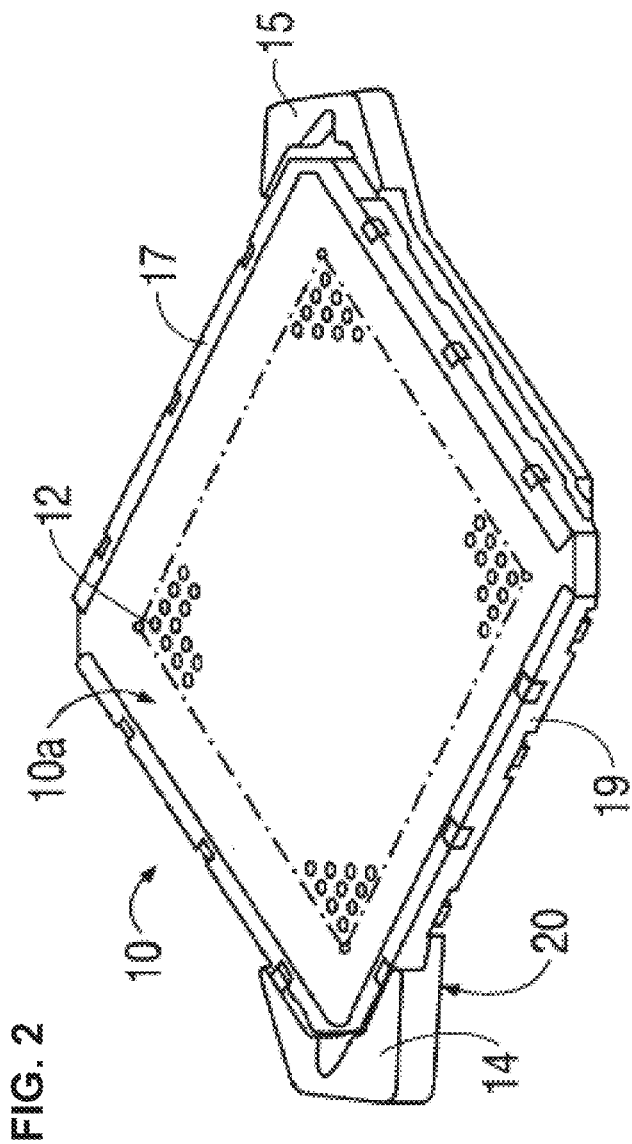
FIG. 2 is a perspective view of another ZIF socket.
Figure 3:
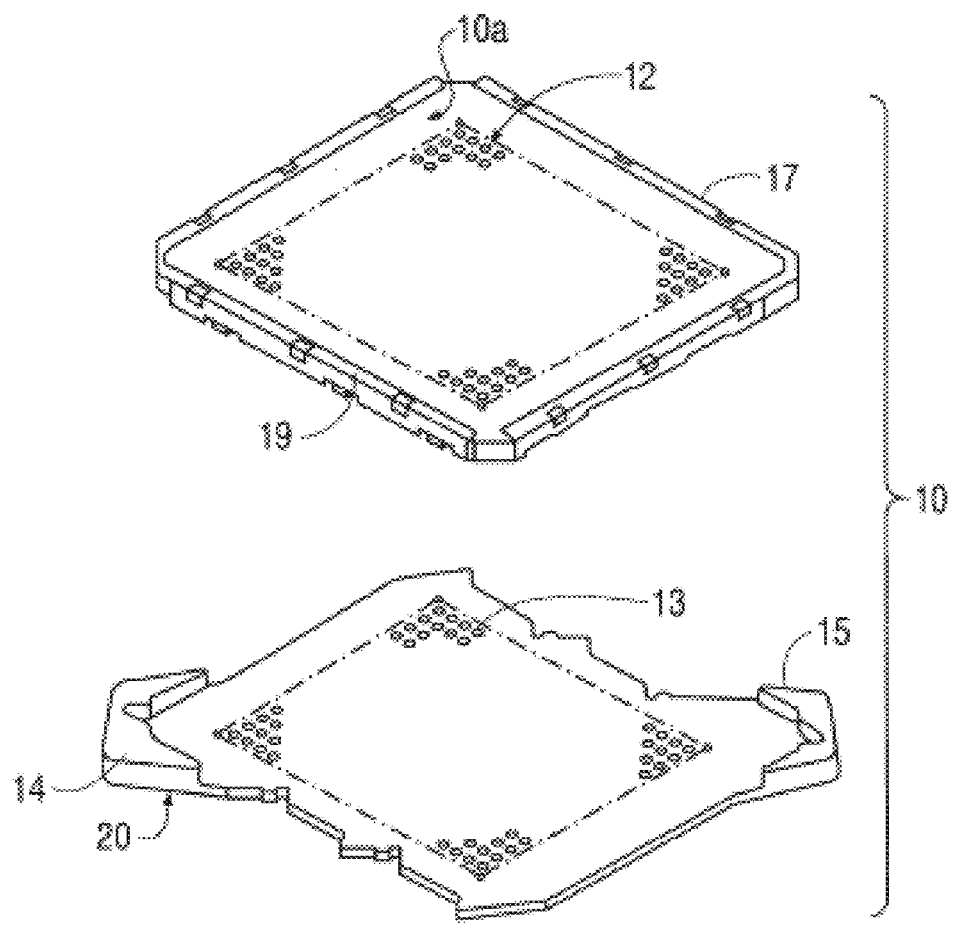
FIG. 3 is an exploded view of the socket of FIG. 2.

Attention is now directed to the perspective view of FIG. 2 and FIG. 3, in which there is depicted a ZIF socket 10 which includes a base 20, a top plate or cover 10*a* movably supported on the base 20 and adapted to retain electronics such as a processor (not shown). The base 20, seen in FIG. 3, defines a plurality of receptacles 13 for receiving and retaining contact pins (not shown). The top plate 10*a* defines a plurality of pin insertion apertures 12 corresponding to the receptacles 13 for receiving pins of the external device whereby the pins extend through the apertures 12 and are partially received in the receptacles 13. Activation means (not shown), such as a caming mechanism or screwdriver, can be incorporated in or used with a cam mechanism (e.g., the cam mechanism 30 shown in FIG. 4) for moving the top plate/cover 10*a* with respect to the base 20 in a diagonal direction along a line between the two ears 14, 15 of the base 20 thereby engaging the pins of the external device that extend through the apertures 12 of the top plate 10*a* and into the receptacles 13 of the base 20. The cover or top plate 10*a* is made of insulative material, such as plastic, and includes thin (sheet metal) reinforcing frames 17, 19, which are shown co-extensive with the perimeter of the top plate 10*a*. The frames 17, 19 are intended to protect the top plate 10*a* from an actuation force, but also to a limited extent, to enhance the rigidity thereof and suppress warpage during manufacture and operation. The thin frames 17, 19 only provide limited rigidity and warpage protection due in part to their size.

Figure 4:
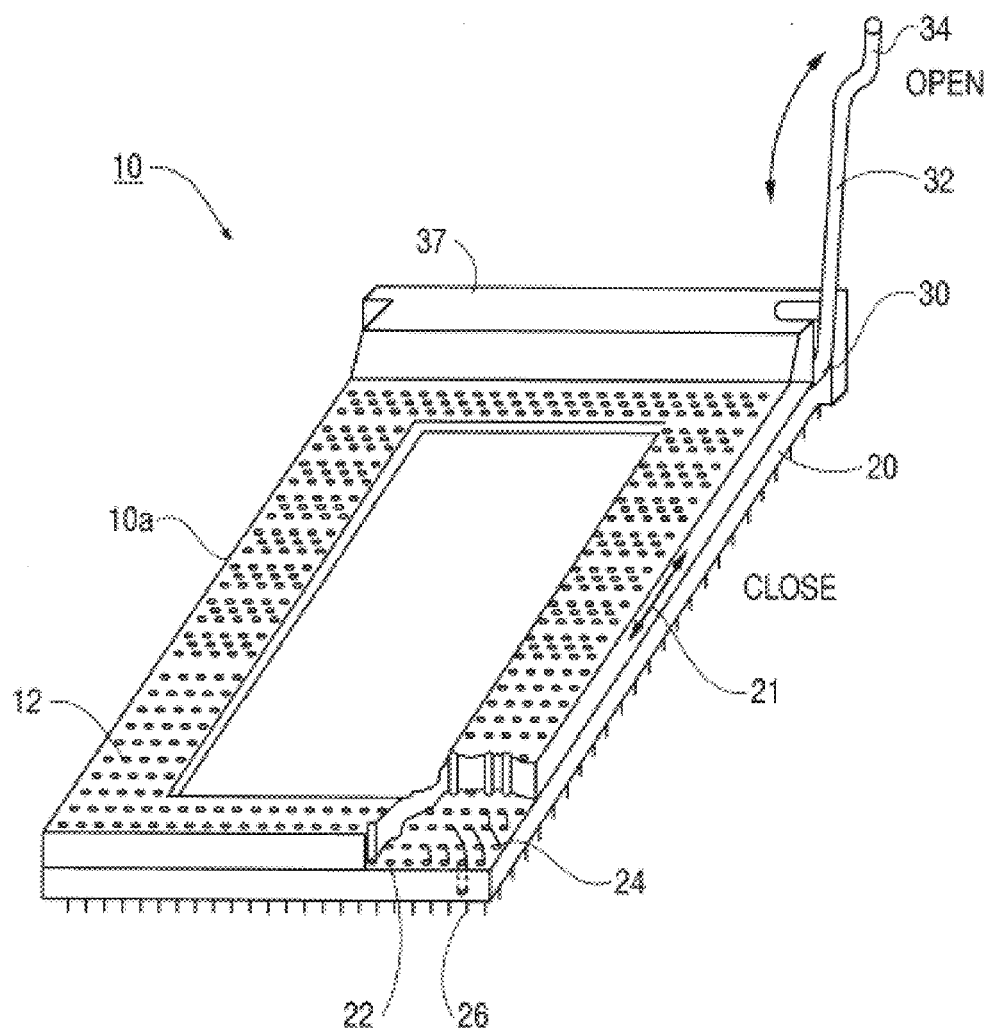
FIG. 4 is a perspective view of yet another example of a ZIF socket.

FIG. 4 illustrates another ZIF socket 10 used to secure an electronic package onto an electronic system board. The ZIF socket 10 can include a top plate (cover) 10*a*, a base 20, and a cam mechanism 30. The top plate 10*a* can be slidably mounted on the base 20 as is indicated by double-headed arrow 21. The top plate 10*a* can be movable over an interior bottom surface of the base 20 between an open position and a closed position in response to movement induced by the cam mechanism 30.

The top plate 10*a* can contain a plurality of pin insertion apertures 12 for accepting electrical pins from an electronic package such as an open die processor chip. The base 20 may contain a corresponding plurality of openings (receptacles) 22, housing spring elements 24, each of which has a tail portion 26. The tail portions 26 may protrude through a plurality of corresponding openings formed in a system board (not shown) and can be soldered, for example, to the system board circuitry of an electronic system. When the top plate 10*a* is in an open position, that is, when the top plate 10*a* moves in a first direction toward an open position, the electrical pins (e.g. connections) of an electronic package such as a processor chip can be inserted through the apertures 12 in the top plate 10*a* and into their respective openings (receptacles) 22 in the base 20 and the spring elements 24. When the top plate 10*a* is in a closed position, that is, when the top plate moves in a second, opposite direction toward a closed position, the electrical pins of an electronic package can be engaged physically (e.g. pinched or welded) and electrically engage the respective spring elements 24 of the base 20. Conversely, when the top plate 10*a* moves again back toward an open position, the pins of an electronic package can be physically disengaged from the respective spring elements 24 of the base 20 for ease of removal of the electronic package from the ZIF socket 10.

The cam mechanism 30 provides a means for sliding the top plate 10*a* over the base 20 between the open and closed positions. The cam mechanism can be mounted in a tunnel shaped space between the top plate 10*a* and the base 20, and can be located inside a raised portion 37 of the top plate 10*a*. The cam mechanism 30 may include a lever 32, which is transversely connected to rotate a cam element to cause the top plate 10*a* to translate relative to the base 20. The lever 32 may contain an end portion 34, which is bent at an angle of approximately 15°-45° from the axis of the lever 32. The bent end 34 of the lever may allow for the lever 32 to be easily grasped for rotation in the horizontal direction to translate the top plate 10*a* over the base 20 between open and closed positions.

With each of the examples disclosed in FIGS. 1-4, warpage to a component can result in misalignment or damage to electronics assembled to the socket. Any of the sockets of FIGS. 1-4 can be configured to use a contact pattern having a generally circular shape, as described herein, in place of the illustrated rectilinear contact patterns.

FIG. 5A is a perspective view of electronics assembled to a housing or socket 504, according to an example. FIG. 5B is a side view of the assembly of FIG. 5A. An electronics assembly 500 can include a socket 504 used to couple electronics such as an integrated circuit 502 to other electronics such as a printed circuit board 514 (shown in FIG. 5B). Sockets contemplated include, but are not limited to, LGA Sockets, LIF sockets and ZIF sockets.

The socket 504 can include a housing that can have an exterior 515 and an interior 516. The exterior 515 can have an exterior bottom surface 518. The interior 516 can be defined by an interior bottom surface 520 and at least one sidewall 522 extending away from the interior bottom surface 520 to define an interior shape sized to receive the integrated circuit 502.

The integrated circuit 502 can be disposed against the interior bottom surface 520, e.g. abutting it. The integrated circuit 502 can be disposed against the at least one sidewall 522, e.g. abutting it. One or both the socket 504 and another component, to which the socket is mounted, such as a circuit board 514, can include features to stabilize spaced apart alignment between them. Features to provide support for a socket spaced apart from a circuit board can include protrusions such as moldings such as seating planes, webs, bosses, ramps and the like. Contacts electrically and mechanically linking the socket to the circuit board can additionally support the socket spaced apart from the circuit board.

A plurality of exterior contacts 524 (showing in hidden view in FIG. 5A and in side view in FIG. 5B) can be exposed along the exterior bottom surface 518 and can connect the socket 504 to the circuit board 514. The exterior contacts 524 can be oriented in an exterior contact pattern 526. The exterior contact pattern 526 can be generally circular in shape. The minimum number or contacts can be any number although the advantages increase with the pin count. The plurality of exterior contacts can include at least one thousand contacts. The plurality of exterior contacts can include at least two thousand contacts. A benefit of the circular pattern is that the area of the pattern can consume less than the area of a rectangular pattern with the same number of contacts.

A plurality of interior contacts 528 can be disposed along the interior 516. The plurality of interior contacts 528 are not illustrated in FIG. 5A to improve clarity of the figure. Each of the interior contacts 528 can be in electrical communication with an exterior contact 524 of the plurality of exterior contacts. Each of the plurality of interior contacts 528 can extend away from the interior bottom surface into the interior 516 of the housing, exposed to the interior 516. At least a portion of the plurality of interior contacts 528 can be aligned with the plurality of exterior contacts 524, with each interior contact of the plurality of interior contacts being coextensive with an exterior contact of the plurality of exterior contacts. The interior contact pattern 526 can be coextensive with the exterior contact pattern. Each of the interior contacts can be aligned along an axis with a respective exterior contact. At least a portion of the plurality of interior contacts can be aligned with the plurality of exterior contacts, with each interior contact of the plurality of interior contacts being coaxial with an exterior contact of the plurality of exterior contacts.

One or both of the contact patterns can be centered in the socket 504. One or both of the contact patterns can be asymmetrical along a first plane 506. One or both of the contact patterns can be symmetrical along a first plane 506. The first plane 506 can be orthogonal to the interior bottom surface 520. The first plane 506 can bisect the socket 504. A second plane 508 can be orthogonal to the first plane 506. The second plane 508 can be orthogonal to the bottom 520. The second plane 508 can bisect the socket 504. One or both of the contact patterns can be asymmetrical along a second plane 508. One or both of the contact patterns can be symmetrical along a second plane 508. For each of the plurality of contacts disposed on one side of the first plane 506 there can be another of the plurality of contacts disposed opposite the first plane 506, equidistant from the first plane.

The at least one sidewall 522 can be one of four sidewalls, 522-522c, which, along with the bottom surface 520, define the interior 516. The interior 516 can be rectilinear. The interior 516 can be a regular hexahedron, although the present subject matter is not so limited. The interior 516 can be cylindrical or have the shape of extruded ellipses. A pair of sidewalls 522, 522b opposing one another can define the interior 516. The interior can be defined by another pair of sidewalls 522a, 522c opposing one another. The two pairs can be situated orthogonal to one another. Rather than leaving spaces between them as pictured, two sidewalls can meet one another at corner apexes (e.g., to form ears 14, 15 illustrated in FIG. 3). However, as illustrated in FIGS. 5A-B, a first pair of sidewalls can be spaced apart from a second pair of sidewalls and the interior can be sized to receive a center portion 532 of the integrated circuit with a remainder 534 of the integrated circuit overhanging the housing.

At least one sidewall can include a top contact 536 that can be disposed opposite the bottom exterior surface 518 and electrically connected to a bottom contact 536 of the socket 504. The bottom contact 536 can be disposed along the bottom exterior surface 520. The at least one sidewall 522 can define a channel 538 extending from the bottom exterior surface to a sidewall opening at a top of the at least one sidewall.

One advantage of the socket pictured in FIGS. 5A-5B is that, in addition to accommodating the rectangular package illustrated, other n-gonal shapes can be used, including but not limited to, circles, near-circles (where n is very large) and other shapes such as octagons, including regular octagons.

Figure 6A:
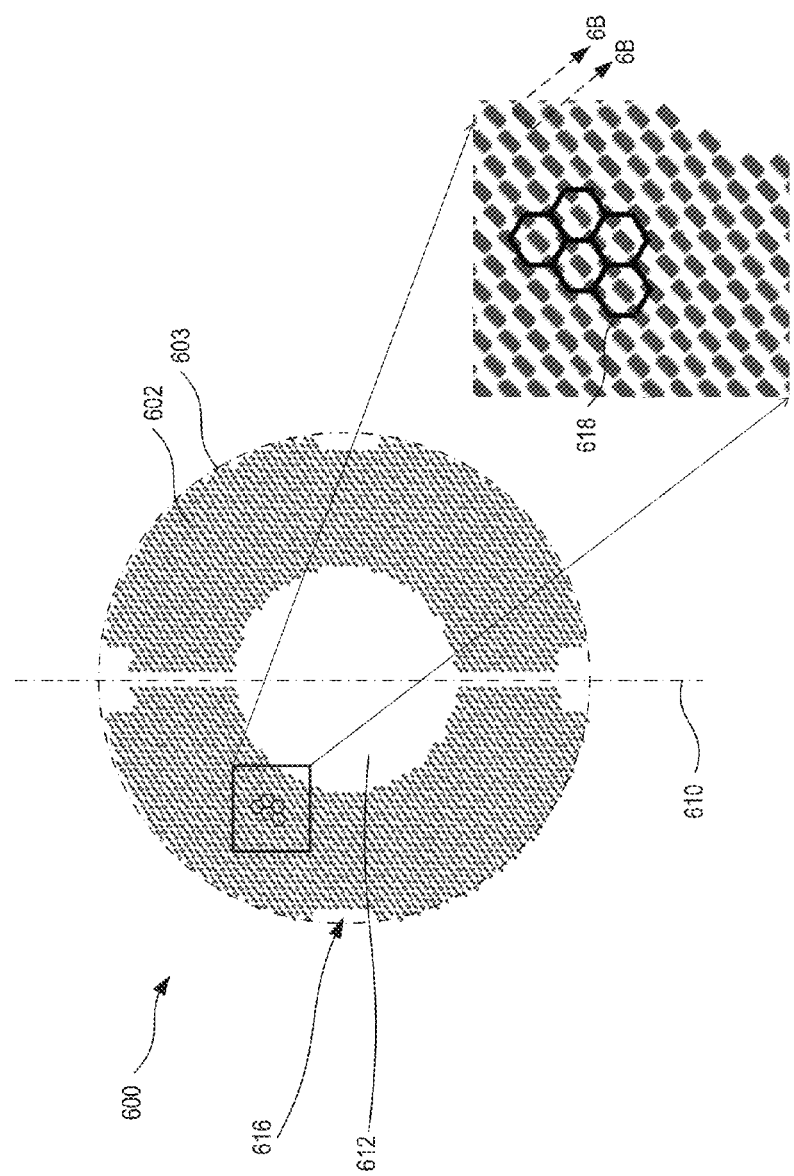
FIG. 6A is a schematic of cantilevers of contacts in a generally circular pattern, according to an example.

FIG. 6A is a schematic of contacts disposed in a socket in a generally circular pattern, according to an example. The housing to which the contacts are coupled is illustrated in 6B. As illustrated, the plurality of contacts 602 can be disposed along the exterior bottom surface and interior bottom surface in an overall pattern 603, which can include a regular contact-to-contact pattern 618. The pattern 618 can be a regular hexagonal pattern, although the present subject matter is not so limited, and other n-gonal contact patterns can be used.

The plurality of contacts 602 can define a perimeter 603 of an n-gonal shape, where n can be greater than 4. The plurality of contacts can define an exterior perimeter of an n-gonal shape, where n can be greater than 12. The n-gonal shape can be a regular n-gonal shape. The plurality of contacts can defining opposing c-shapes can have openings facing one another, for example facing plane 610.

Contacts 602 can surround an interior portal 612 that can extend through the housing, providing for passage of components from the circuit board to which the housing is mounted. These components can couple to other portions of an integrated circuit disposed in the socket or to other electronics.

A plurality of contacts can be disposed along a surface in a rectilinear pattern, as illustrated in FIG. 4, on one side of a socket, while being in a circular pattern on an opposite side of the socket. For example, interior contacts can define a rectangular pattern, while exterior contacts define a circular pattern. The rectilinear pattern can be regular.

Figure 6B:
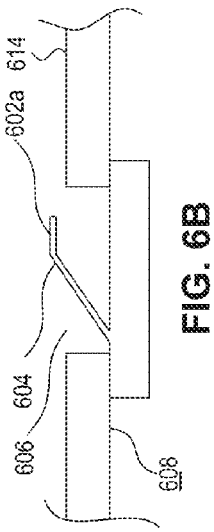
FIG. 6B is a side view of the assembly of FIG. 6A taken along line 6B-6B, showing a housing not visible in FIG. 6A.

FIG. 6B is a side view of the assembly of FIG. 6A taken along line 6B-6B. Each of the plurality of interior contacts can include a compliant contact such as a cantilever 604. Each of the cantilevers can be elastically deformable into a relief 606 disposed in the housing, below the interior bottom surface 608 of the housing 614. The plurality of interior contacts can be configured to couple a land grid array (LGA) package to a board.

As can be seen, barring the areas 616 where the contacts have been depopulated for seating planes and the areas with slight irregularity in the periphery due to the hexagonal contact pattern, each point on the periphery is approximately at the same distance from the center 0 mm, 0 mm and corners are eliminated. This symmetric geometry can provide several benefits. For example, in instances when the housing 614 is symmetrically warped, the shape of the socket exhibits less average deformation per contact, thus mitigating the effect of warpage, e.g. along solder joints, improving solder joint quality. Further, contact with electronics is improved.

Figure 7:
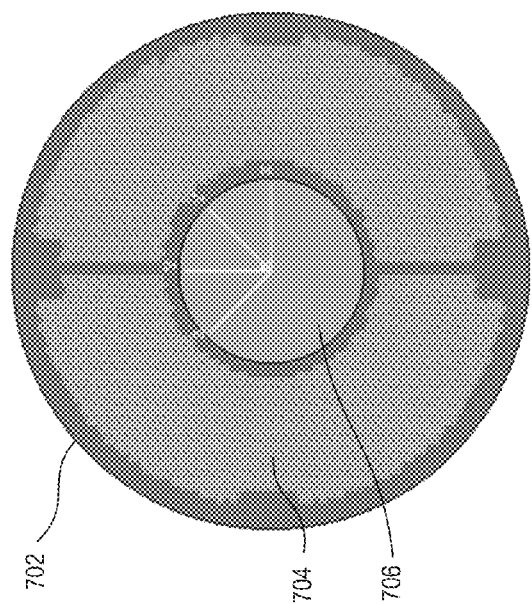
FIG. 7 is diagram in which a socket including contacts disposed in a generally circular pattern parsed into finite elements, according to an example.
Figure 7:
Figure 8:
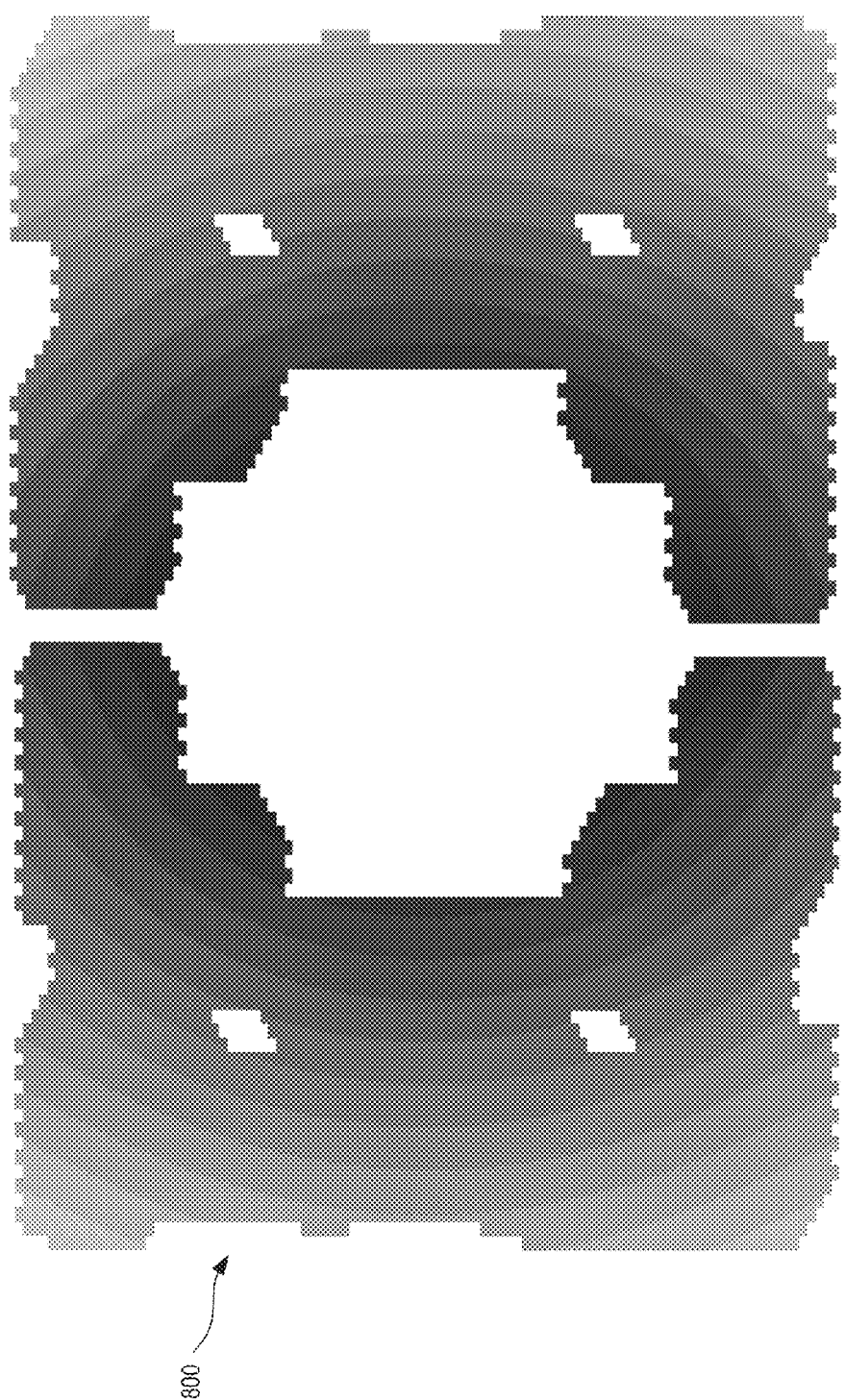
FIG. 8 illustrates stress typically experienced by the sockets such as those of FIGS. 1-4.
Figure 9:
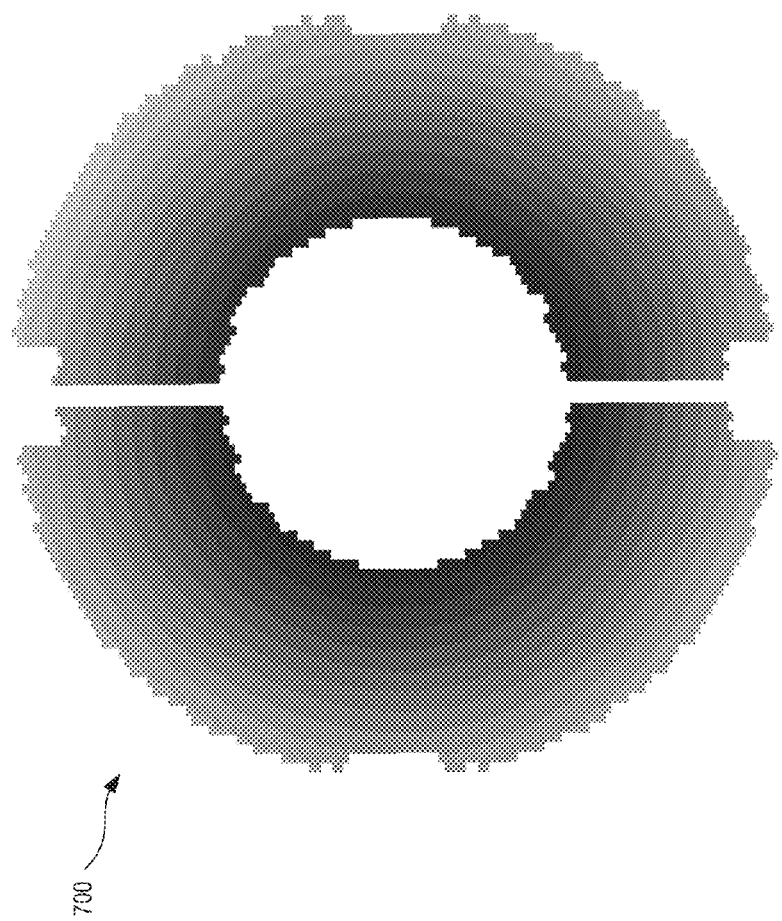
FIG. 9 illustrates stress typically experienced by the socket of FIG. 7, according to an example.

FIG. 7 is diagram in which a socket including contacts disposed in a generally circular pattern is parsed into finite elements, according to an example. FIG. 8 illustrates stress typically experienced such as by the sockets of FIGS. 1-4. FIG. 9 illustrates stress typically experienced by the socket of FIG. 7, according to an example. The difference in shading darkness shows a stress differential, with lighter colors representing higher stress. Returning to FIG. 7, an assembly 700 can include a circuit board 702, to which a socket is mated along a plurality of contact 704. A portal for electronics 706 is also pictured.

The pattern or shape of contacts 704 can be termed a gestalt, which is a structure, configuration, or pattern of physical phenomena so integrated as to constitute a functional unit with properties not derivable by summation of its parts. The circular pattern of contacts provides structural benefits not realized by individual contacts or other contact shapes. As illustrated in FIG. 9, stress levels for the assembly 700 along the contacts is less at its extremes than the configuration of the assembly 800 of FIG. 8, which includes the same number of contacts. Average stress per contact can be lower as well. This reduction in stress better accommodates any warpage imparted onto the socket by another component such as a circuit board. The same holds true at the interface between an integrated circuit and the socket, in which one or both may be warped or assembled together incorrectly.

Figure 10:
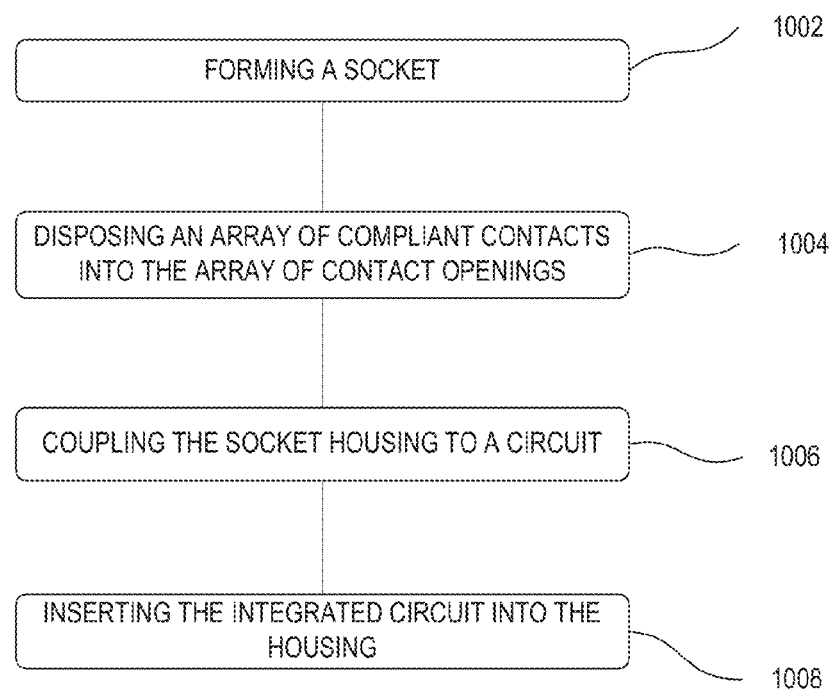
FIG. 10 is a method of assembling an integrated circuit to a circuit, according to an example.

FIG. 10 is a method of assembling an integrated circuit to a system board, according to an example. The method 1000 can include, at 1002, forming a socket housing. A socket housing can be formed to include an interior that can include an interior bottom surface can be formed. The socket housing can be formed to include an exterior bottom surface. The socket housing can be formed to include a generally circular array of contact openings extending along the exterior bottom surface to the exterior bottom surface. At 1004, the method 1000 can include disposing an array of compliant contacts into the array of contact openings. Disposing the array of compliant contacts can include press-fitting the array of compliant contacts. At 1006 the method 1000 can include coupling the socket housing to the circuit. Coupling the socket housing to a circuit can include soldering the socket housing to the circuit, for e.g. a circuit board such as a motherboard. At 1008 the method 1000 can include inserting the integrated circuit, e.g. a CPU, into the housing. Inserting the integrated circuit can include actuating a low insertion force mechanism. Inserting the integrated circuit can include elastically deforming the array of compliant contacts.

Figure 11:
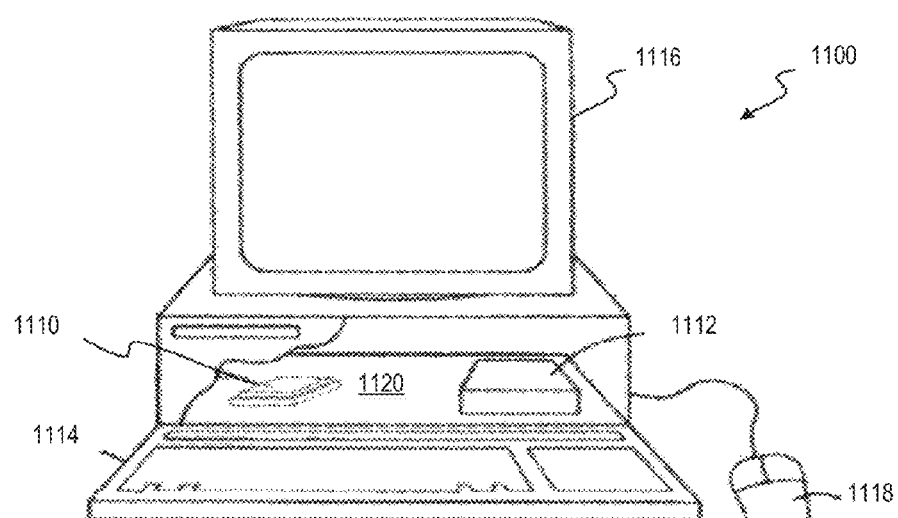
FIG. 11 depicts a computing system according to an example.

FIG. 11 depicts a computing system 1100 according to an example. One or more of the foregoing examples of socket assemblies, such as those manufactured according to a foregoing process, can be utilized in a computing system, such as computing system 1100 of FIG. 11. A socket manufactured according to a method embodiment alone or in combination with any other embodiment can be referred to as an example (s) configuration.

The computing system 1100 can include processor, which can be enclosed in an IC chip package 1110, a data storage system 1112, input device such as a keyboard 1114, and output device such as a monitor 1116. The computing system 1100 can include a processor that processes data signals and may include, for example, a microprocessor available from INTEL CORPORATION. In addition to the keyboard 1114, the computing system 1100 can include another user input device such as a mouse 1118.

The computing system 1100 embodying components in accordance with the claimed subject matter can include any system that utilizes a microelectronic device system, which may include, for example, the socket assemblies described above, such as those manufactured according to a method example, which can be coupled to data storage such as dynamic random access memory (DRAM), polymer memory, flash memory, and phase-change memory. Certain example(s) can be coupled to any combination of these by being coupled to a processor. Data storage can include an embedded DRAM cache on a die. Example(s) configuration coupled to the processor can be part of a system with an example(s) configuration coupled to the data storage of the DRAM cache. Example(s) configuration can be coupled to the data storage system 1112.

In an example, the computing system 1100 can also include a die that contains a digital signal processor (DSP), a micro controller, an application specific integrated circuit (ASIC), or a microprocessor. An example(s) configuration can be coupled to any combination of these by being coupled to a processor. For example, a DSP can be part of a chipset that can include a stand-alone processor and the DSP as separate parts of the chipset on a board 1120. An example(s) configuration can be coupled to the DSP and a separate example(s) configuration can be present that can be coupled to the processor in the IC chip package 1110. Additionally in an example, an example(s) configuration can be coupled to a DSP that can be mounted on the same board 1120 as the IC chip package 1110. An example(s) configuration can be combined as set forth with respect to the computing system 1100, in combination with an example(s) configuration as set forth by the various examples of the socket assemblies manufactured according to a method example within this disclosure and their equivalents.

Examples set forth in this disclosure can be applied to devices and apparatuses other than a traditional computer. For example, a die can be packaged with an example(s) configuration and placed in a portable device such as a wireless communicator or a hand-held device such as a smart phone, a personal data assistant and the like. Another example can be a die that can be packaged with an example(s) configuration and placed in a vehicle such as an automobile, a locomotive, a watercraft, an aircraft, or a spacecraft.

Figure 12:
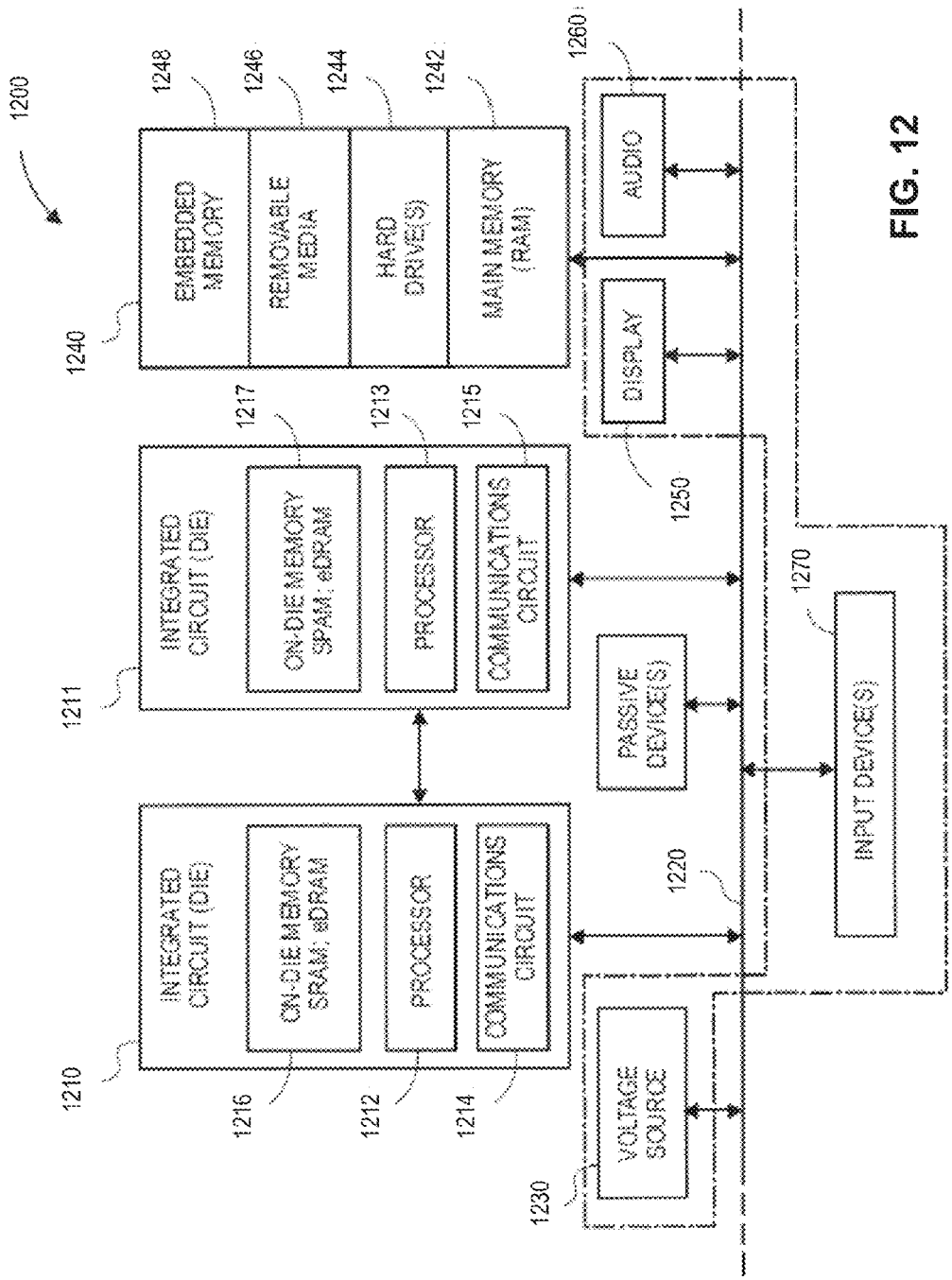
FIG. 12 is a schematic of an electronic system according to an example.

FIG. 12 is a schematic of an electronic system 1200 according to an example. The electronic system 1200 as depicted can embody the computing system 1100 depicted in FIG. 11, with the electronic system can be depicted schematically. The electronic system 1200 incorporates electronic assembly 1210, such as an IC die illustrated above. In an example, the electronic system 1200 can be a computer system that can include a system bus 1220 to electrically couple the various components of the electronic system 1200. The system bus 1220 can be a single bus or any combination of busses according to various examples. The electronic system 1200 can include a voltage source 1230 that provides power to the integrated circuit 1210. In some examples, the voltage source 1230 supplies current to the integrated circuit 1210 through the system bus 1220.

The integrated circuit 1210 is electrically coupled to the system bus 1220 and includes any circuit or combination of circuits according to an example. In an example, the integrated circuit 1210 includes a processor 1212 that can be of any type. As used herein, the processor 1212 means any type of circuit such as, but not limited to, a microprocessor, a microcontroller, a graphics processor, a digital signal processor, or another processor. Accordingly, a socket can be part of the electronic system that seats two dice, such as a processor first die and a second die selected from a processor or another die that is part of a chipset. Other types of circuits that can be included in the integrated circuit 1210 are a custom circuit or an ASIC, such as a communications circuit 1214 for use in wireless devices such as cellular telephones, pagers, portable computers, two-way radios, and similar electronic systems. In an example, the integrated circuit 1210 includes on-die memory 1216 such as static random-access memory (SRAM). In an example, the integrated circuit 1210 includes on-die memory 1216 such as embedded dynamic random-access memory (eDRAM).

In an example, the electronic system 1200 also includes an external memory 1240 that in turn may include one or more memory elements suitable to the particular application, such as a main memory 1242 in the form of RAM, one or more hard drives 1244, and/or one or more drives that handle removable media 1246, such as diskettes, compact disks (CDs), digital video disks (DVDs), flash memory keys, and other removable media known in the art.

In an example, the electronic system 1200 also includes a display device 1250 and an audio output 1260. In an example, the electronic system 1200 includes an input 1270, such as a keyboard, mouse, trackball, game controller, microphone, voice-recognition device, or any other device that inputs information into the electronic system 1200.

As shown herein, integrated circuit 1210 can be implemented in a number of different examples, including an electronic package, an electronic system, a computer system, one or more methods of fabricating an integrated circuit, and one or more methods of fabricating an electronic assembly that includes the socket assemblies as set forth herein in the various examples and their art-recognized equivalents. The elements, materials, geometries, dimensions, and sequence of operations can all be varied to suit particular packaging requirements.

EXAMPLES AND NOTES

Example 1 includes subject matter (such as an apparatus, a method, a means for performing acts, or a device readable medium including instructions that, when performed by the device, can cause the device to perform acts) comprising an apparatus for coupling an integrated circuit to other electronics. An example can include a housing having an exterior and an interior, the exterior having an exterior bottom surface, the interior defined by an interior bottom surface opposite the exterior bottom surface, and at least one sidewall extending away from the interior bottom surface to define an interior shape that is sized to receive the integrated circuit, with the integrated circuit disposed against the interior bottom surface and the at least one sidewall. An example can include a plurality of exterior contacts exposed along the exterior bottom surface in an exterior contact pattern that is generally circular in shape. An example can include a plurality of interior contacts, each in electrical communication with an exterior contact of the plurality of exterior contacts, with each of the plurality of interior contacts extending away from the interior bottom surface into the interior of the housing, exposed to the interior.

Example 2 can include, or can optionally be combined with the subject matter of Example 1 wherein the plurality of interior contacts is disposed along the interior bottom surface in an interior contact pattern that is generally circular shape.

Example 3 can include, or can optionally be combined with the subject matter of one or any combination of Examples 1 through 2 wherein the interior contact pattern is coextensive with the exterior contact pattern.

Example 4 can include, or can optionally be combined with the subject matter of one or any combination of Examples 1 through 3 wherein the exterior contact pattern is centered in the housing.

Example 5 can include, or can optionally be combined with the subject matter of one or any combination of Examples 1 through 4 wherein the interior contact pattern is centered in the housing.

Example 6 can include, or can optionally be combined with the subject matter of one or any combination of Examples 1 through 5 wherein at least a portion of the plurality of interior contacts is aligned with the plurality of exterior contacts, with each interior contact of the plurality of interior contacts being coaxial with an exterior contact of the plurality of exterior contacts.

Example 7 can include, or can optionally be combined with the subject matter of one or any combination of Examples 1 through 6 wherein at least a portion of the plurality of interior contacts is aligned with the plurality of exterior contacts, with each interior contact of the plurality of interior contacts being coextensive with an exterior contact of the plurality of exterior contacts.

Example 8 can include, or can optionally be combined with the subject matter of one or any combination of Examples 1 through 7 wherein the apparatus is a low insertion force socket.

Example 9 can include, or can optionally be combined with the subject matter of one or any combination of Examples 1 through 8 wherein the apparatus is a zero insertion force socket.

Example 10 can include, or can optionally be combined with the subject matter of one or any combination of Examples 1 through 9 wherein the plurality of exterior contacts includes at least one thousand contacts.

Example 11 can include, or can optionally be combined with the subject matter of one or any combination of Examples 1 through 10 wherein the plurality of exterior contacts includes at least two thousand contacts.

Example 12 can include, or can optionally be combined with the subject matter of one or any combination of Examples 1 through 11 wherein a plurality of exterior contacts exposed to the interior, the plurality of exterior contacts defining an exterior perimeter of an n-gonal shape, where n is greater than 4.

Example 13 can include, or can optionally be combined with the subject matter of one or any combination of Examples 1 through 12 wherein a plurality of exterior contacts exposed to the interior, the plurality of exterior contacts defining an exterior perimeter of an n-gonal shape, where n is greater than 12.

Example 14 can include, or can optionally be combined with the subject matter of one or any combination of Examples 1 through 13 wherein the n-gonal shape is a regular n-gonal shape.

Example 15 can include, or can optionally be combined with the subject matter of one or any combination of Examples 1 through 14 wherein the plurality of interior contacts are compliant contacts, and the plurality of exterior contacts connect a land grid array (LGA) package to a circuit.

Example 16 can include, or can optionally be combined with the subject matter of one or any combination of Examples 1 through 15 wherein the plurality of exterior contacts is symmetrical along a first plane that is orthogonal to the bottom and that bisects the housing.

Example 17 can include, or can optionally be combined with the subject matter of one or any combination of Examples 1 through 16 wherein the plurality of exterior contacts is symmetrical along a second plane, orthogonal to the first plane, that is orthogonal to the bottom and that bisects the housing.

Example 18 can include, or can optionally be combined with the subject matter of one or any combination of Examples 1 through 17 wherein for each of the plurality of exterior contacts disposed on one side of the first plane, there is another of the plurality of exterior contacts disposed opposite the first plane, equidistant from the first plane.

Example 19 can include, or can optionally be combined with the subject matter of one or any combination of Examples 1 through 18 wherein the plurality of exterior contacts is asymmetrical along a first plane that is orthogonal to the bottom and that bisects the housing.

Example 20 can include, or can optionally be combined with the subject matter of one or any combination of Examples 1 through 19 wherein the plurality of exterior contacts is asymmetrical along a second plane, orthogonal to the first plane that is orthogonal to the bottom and that bisects the housing.

Example 21 can include, or can optionally be combined with the subject matter of one or any combination of Examples 1 through 20 wherein the at least one sidewall is one of four sidewalls defining a the interior as being rectilinear with a first pair of sidewalls opposing one another, and a second pair of sidewalls, situated orthogonal to the first pair of sidewalls, oppose one another.

Example 22 can include, or can optionally be combined with the subject matter of one or any combination of Examples 1 through 21 wherein the first pair of sidewalls meet the second pair of sidewalls at corner apexes.

Example 23 can include, or can optionally be combined with the subject matter of one or any combination of Examples 1 through 22 wherein the first pair of sidewalls is spaced apart from the second pair of sidewalls and the interior is sized to receive a center portion of the integrated circuit with a remainder of the integrated circuit overhanging the housing.

Example 24 can include, or can optionally be combined with the subject matter of one or any combination of Examples 1 through 23 wherein the interior is shaped like a regular hexahedron.

Example 25 can include, or can optionally be combined with the subject matter of one or any combination of Examples 1 through 24 wherein the plurality of exterior contacts are spaced apart from the at least one sidewall, with the plurality of exterior contacts defining opposing c-shapes having openings facing one another.

Example 26 can include, or can optionally be combined with the subject matter of one or any combination of Examples 1 through 25 wherein the plurality of interior contacts and the plurality of exterior contacts surround an interior portal extending through the housing.

Example 27 can include, or can optionally be combined with the subject matter of one or any combination of Examples 1 through 26 wherein the plurality of exterior contacts are disposed along the exterior bottom surface in a regular pattern.

Example 28 can include, or can optionally be combined with the subject matter of one or any combination of Examples 1 through 27 wherein the plurality of exterior contacts are disposed along the exterior bottom surface in a regular contact-to-contact hexagonal pattern.

Example 29 can include, or can optionally be combined with the subject matter of one or any combination of Examples 1 through 28 wherein the plurality of exterior contacts are disposed along the exterior bottom surface in a rectilinear contact-to-contact pattern.

Example 30 can include, or can optionally be combined with the subject matter of one or any combination of Examples 1 through 29 wherein the rectilinear pattern is regular.

Example 31 can include, or can optionally be combined with the subject matter of one or any combination of Examples 1 through 30 wherein the at least one sidewall includes a top contact disposed opposite the bottom exterior surface and electrically connected to a bottom contact of the housing disposed long the bottom exterior surface.

Example 32 can include, or can optionally be combined with the subject matter of one or any combination of Examples 1 through 31 wherein the at least one sidewall defines a channel extending from the bottom exterior surface to a sidewall opening at a top of the at least one sidewall.

Example 33 can include, or can optionally be combined with the subject matter of one or any combination of Examples 1 through 32 wherein each of the plurality of interior contacts comprises a cantilever.

Example 34 can include, or can optionally be combined with the subject matter of one or any combination of Examples 1 through 33 wherein each of the cantilevers is elastically deformable into a relief disposed in the housing, below the interior bottom surface.

Example 35 includes subject matter (such as an apparatus, a method, a means for performing acts, or a device readable medium including instructions that, when performed by the device, can cause the device to perform acts) comprising a method of forming a socket comprising. An example can include forming a socket housing comprising. An example can include forming an interior including an interior bottom surface. An example can include forming an exterior bottom surface. An example can include coupling an array of contacts to the exterior bottom surface to define a generally circular array of contacts.

Example 36 can include, or can optionally be combined with the subject matter of Example 35 wherein forming the housing includes forming an array of contact openings extending from the exterior bottom surface of the housing to the interior bottom surface of the housing.

Example 37 can include, or can optionally be combined with the subject matter of one or any combination of Examples 35 through 36 wherein coupling an array of contacts to the exterior bottom surface includes disposing the array of contacts into the array of contact openings.

Example 38 can include, or can optionally be combined with the subject matter of one or any combination of Examples 35 through 37 wherein disposing an array of contacts into the array of contact openings includes disposing an array of compliant contacts extending through the openings.

Example 39 can include, or can optionally be combined with the subject matter of one or any combination of Examples 35 through 38 wherein disposing an array of compliant contacts extending through the openings includes defining a generally circular interior contact pattern.

Example 40 can include, or can optionally be combined with the subject matter of one or any combination of Examples 35 through 39 wherein disposing the array of contacts includes press-fitting the array of compliant contacts.

Example 41 can include, or can optionally be combined with the subject matter of one or any combination of Examples 35 through 40 wherein coupling the array of contacts includes press-fitting the array of compliant contacts.

Example 42 includes subject matter (such as an apparatus, a method, a means for performing acts, or a device readable medium including instructions that, when performed by the device, can cause the device to perform acts) comprising a method of assembling an integrated circuit to a circuit, the method comprising. An example can include forming a socket housing comprising. An example can include forming an interior including an interior bottom surface. An example can include forming an exterior bottom surface. An example can include forming a generally circular array of contact openings extending along the exterior bottom surface to the exterior bottom surface. An example can include disposing an array of compliant contacts into the array of contact openings. An example can include coupling the socket housing to the circuit. An example can include inserting the integrated circuit into the housing.

Example 43 can include, or can optionally be combined with the subject matter of Example 42 wherein inserting the integrated circuit includes actuating a low insertion force mechanism.

Example 44 can include, or can optionally be combined with the subject matter of one or any combination of Example 42 through 43 wherein coupling the socket housing to the circuit includes soldering the socket housing to the circuit.

Example 45 can include, or can optionally be combined with the subject matter of one or any combination of Examples 42 through 44 wherein inserting the integrated circuit includes elastically deforming the array of compliant contacts.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) can be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features can be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages that have been described and illustrated in order to explain the nature of this invention can be made without departing from the principles and scope of the invention as expressed in the subjoined claims.

What is claimed is:

1. An apparatus for coupling an integrated circuit to other electronics, comprising:
   a housing having an exterior and an interior, the exterior having a substantially planar exterior bottom surface, the interior defined by an interior bottom surface opposite the substantially planar exterior bottom surface, and at least one sidewall extending away from the interior bottom surface to define an interior shape that is sized to receive the integrated circuit, with the integrated circuit disposed against the interior bottom surface and the at least one sidewall;
   a plurality of exterior contacts exposed along the substantially planar exterior bottom surface in an exterior contact pattern that is generally circular in shape; and
   a plurality of interior contacts, each in electrical communication with an exterior contact of the plurality of exterior contacts, with each of the plurality of interior contacts extending away from the interior bottom surface into the interior of the housing, exposed to the interior.

2. The apparatus of claim 1, wherein the plurality of interior contacts is disposed along the interior bottom surface in an interior contact pattern that is generally circular in shape.

3. The apparatus of claim 1, wherein a plurality of exterior contacts are exposed to the interior, the plurality of exterior contacts defining an exterior perimeter of an n-gonal shape, where n is greater than 4.

4. The apparatus of claim 1, wherein the at least one sidewall is one of four sidewalls defining an interior as being rectilinear with a first pair of sidewalls opposing one another, and a second pair of sidewalls, situated orthogonal to the first pair of sidewalls, and opposing one another.

5. The apparatus of claim 4, wherein the first pair of sidewalls is spaced apart from the second pair of sidewalls and the interior is sized to receive a center portion of the integrated circuit with a remainder of the integrated circuit overhanging the housing.

6. The apparatus of claim 1, wherein the plurality of interior contacts and the plurality of exterior contacts surround an interior portal extending through the housing.

7. The apparatus of claim 1, wherein the at least one sidewall includes a top contact disposed opposite the bottom exterior surface and electrically connected to a bottom contact of the housing disposed along the bottom exterior surface.

8. The apparatus of claim 1, wherein the at least one sidewall defines a channel extending from the bottom exterior surface to a sidewall opening at a top of the at least one sidewall.

9. The apparatus of claim 1, wherein each of the plurality of interior contacts comprises a cantilever.

10. The apparatus of claim 9, wherein each of the cantilevers is elastically deformable into a relief disposed in the housing, below the interior bottom surface.

* * * * *